US005398028A

United States Patent [19]

Foon

[11] Patent Number: 5,398,028

[45] Date of Patent: Mar. 14, 1995

[54] JOYSTICK CONTROLLER

[75] Inventor: Lin K. Foon, Kowloon, Hong Kong

[73] Assignee: Quickshot Patent (BVI) Ltd., Virgin Islands (Br.)

[21] Appl. No.: 896,326

[22] Filed: Jun. 10, 1992

[51] Int. Cl.[6] .............................................. H03K 17/94

[52] U.S. Cl. ................................ 341/20; 74/471 XY; 200/6 A; 345/161

[58] Field of Search ............ 341/20; 74/471 XY, 523; 340/456; 345/161; 200/6 A

[56] References Cited

U.S. PATENT DOCUMENTS 4,733,214 3/1988 Andresen ............................ 338/128

4,910,503 3/1990 Brodsky ............................ 341/35 X

OTHER PUBLICATIONS

M. Carmichael, "Joystick Resolving Mechanism", IBM Tech. Discl. Bulletin, vol. 21, No. 12, pp. 5021–5022, May 1979.

M. Carmichael, "Joystick Resolving Mechanism", IBM Tech. Discl. Bulletin, vol. 21, No. 12, pp. 5023–5024, May 1979.

*Primary Examiner*—John K. Peng

*Assistant Examiner*—Thomas J. Mullen, Jr.

*Attorney, Agent, or Firm*—Albert C. Smith

[57] ABSTRACT

An x- and y-axis translating apparatus independently translates the motion of a primary shaft in the x- and y-axis directions simultaneously to transducers which generate electrical signals representative of the motion of the primary shaft in the x- and y-axis directions. The apparatus may include button-activated switches for convenient activation with the thumb or forefinger, or other fingers.

6 Claims, 4 Drawing Sheets

SECTION A-A

SECTION B-B

SECTION C–C

JOYSTICK CONTROLLER

BACKGROUND OF THE INVENTION

The present invention relates to a joystick controller that translates manually established lateral motion in the x- and y-axis directions into representative electrical signals. The controller independently translates the lateral motion in both directions simultaneously and provides electronic signals proportional to the amounts of movement in both directions.

SUMMARY OF THE INVENTION

In accordance with the preferred embodiment of the present invention, the joystick controller translates manually-established positions and motions of a primary shaft in the x-axis direction and in the y-axis direction into representative electrical signals. The lateral movements in the x-axis direction and the y-axis direction are translated through two coextensive shafts that are orthogonal to the primary shaft. The one shaft that translates lateral motion in the y-axis direction is positioned within the other shaft that translates lateral motion in the x-axis direction. Each shaft then activates a slide potentiometer that measures the amount of motion in each respective direction and produces representative electrical signals. The primary shaft may also be equipped with one or more button-activated switches for convenient activation with the thumb or forefinger, or other fingers.

DESCRIPTION OF THE PREFERRED EMBODIMENT

Figure 1:
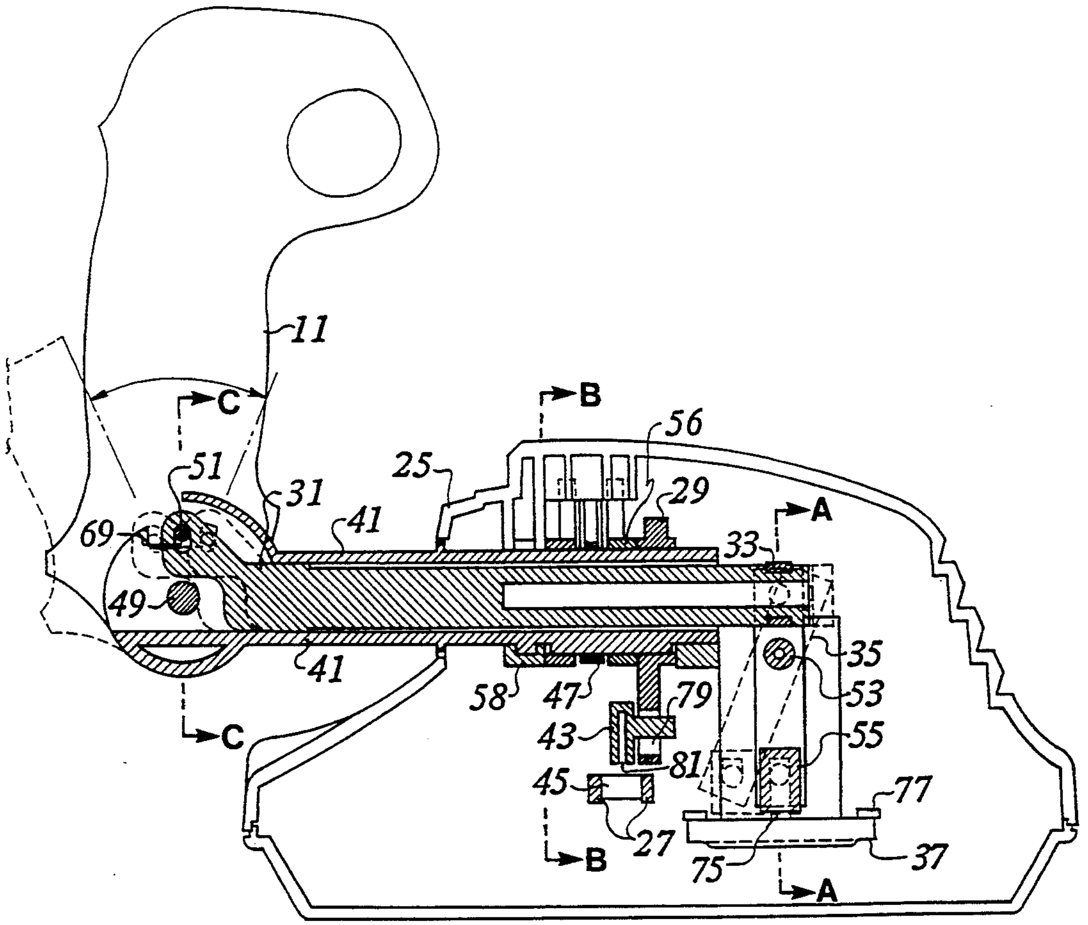
FIG. 1 is a cross-section of the side view of the joystick controller, including the primary shaft and the associated shafts.

In FIG. 1, there is shown a primary shaft 11 for manually establishing motion in the x- and y-axis directions. The motions of the primary shaft 11 in the x- and y-axis directions are independently translated simultaneously to respective transducers through an x- and y-axis translating apparatus. When the primary shaft 11 is moved in the y-axis direction, it activates a y-axis motion translating apparatus, and when the primary shaft 11 is moved in the x-axis direction, it activates x-axis motion translating apparatus. Button-activated switches (not shown) may also be mounted on the primary shaft 11.

In order to translate lateral motion in the y-axis direction and lateral motion in the x-axis direction, the primary shaft 11 is mechanically coupled to a rotational shaft 41 and to a longitudinal shaft 31 that is disposed within the rotational shaft 41. The rotational shaft 41 for translating x-axis motion and the longitudinal shaft 31 for translating y-axis motion are coextensive. More specifically, the longitudinal shaft 31 is positioned inside of the rotational shaft 41. The longitudinal shaft 31 is mounted therein to move freely in a longitudinal direction within the rotational shaft 41 when the primary shaft 11 is moved laterally in the y-axis direction. The longitudinal shaft 31 is mounted to rotate with the rotational shaft 41 which is mounted to rotate within the housing 25 when the primary shaft 11 is moved laterally in the x-axis direction.

Figure 4:
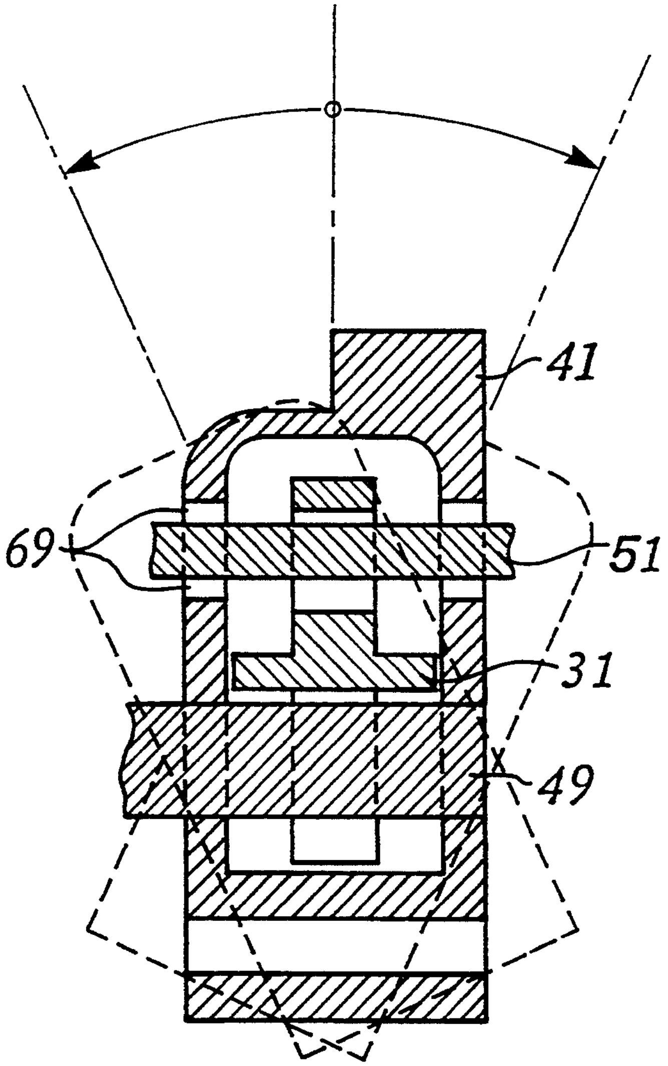
FIG. 4 is a cross-section of the front view of the connection between the primary shaft and the coextensive shafts.

As shown in FIGS. 1 and 4, in order to convey motion of the primary shaft 11 in the y-axis direction, the primary shaft 11 is mounted on the rotational shaft 41 to rotate about a pivot pin 49 that is positioned at the end of the rotational shaft 41. As the primary shaft 11 is moved laterally in the y-axis direction, its motion is transferred to the longitudinal shaft 31 through a camming device which includes a peg 51 that is mounted on the primary shaft 11 above the pivot pin 49. Thus, when the primary shaft 11 is moved in the y-axis direction, the longitudinal shaft 31 moves longitudinally within the rotational shaft 41 by the peg 51 carried in a first slot 69, pushing and pulling the attached longitudinal shaft 31. The peg 51 is only free to move within the cut-out first slot 69 in the rotational shaft 41 and thus limits the lateral motion of the primary shaft 11 in the y-axis direction.

Figure 2:
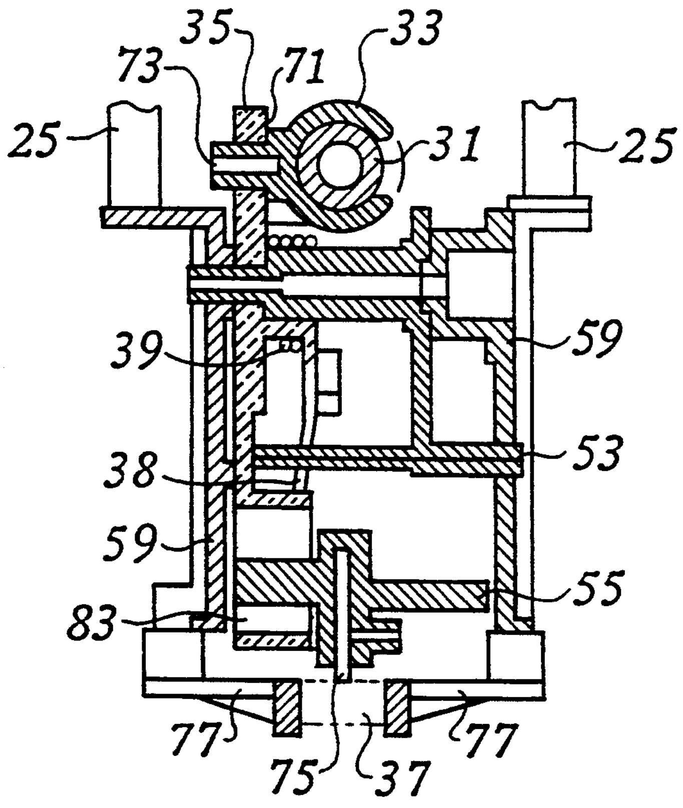
FIG. 2 is a cross-section of the front view of the shaft and potentiometer for motion in the y-axis direction.

As shown in FIGS. 1 and 2, as the longitudinal shaft 31 moves longitudinally, a camming clasp 33 that is coupled to the other end of the longitudinal shaft 31 transfers the motion of the longitudinal shaft 31 to a lateral shaft 35. The peg 73 of the camming clasp 33 is carried in a clasp slot 71 in the lateral shaft 35, as shown in FIG. 2. Thus, the lateral shaft 35 moves laterally at the end of the lateral shaft 35 that is attached to the camming clasp 33. In addition, the lateral shaft 35 is mounted to pivot about a lever point 53 as it moves laterally in the y-axis direction when the primary shaft is moved in the y-axis direction. Finally, as the lateral shaft 35 pivots, a y-axis cam 55 that is connected to the other end of the lateral shaft 35 also moves and activates a slide contact 75 on an electrical y-axis potentiometer 37. The y-axis cam 55 is carried by a second slot 83.

The slide contact 75 of the y-axis potentiometer 37 is attached to the y-axis cam 55. As the y-axis cam 55 moves, the slide contact 75 moves along the y-axis potentiometer 37 in the y-axis direction, thereby varying the resistance or voltage division between the end contacts of the y-axis potentiometer 37 to provide a representative electrical indication of the amount of lateral movement in the y-axis direction of the primary shaft 11. The y-axis potentiometer 37 is mounted on a bracket 77 attached to the inside of the housing 25, as shown in FIGS. 1 and 2.

With respect to motion in the y-axis direction, a front spring 38 and a back spring 40 are positioned on either side of the lateral shaft 35 to maintain the primary shaft 11 in and to restore the primary shaft 11 to its initial, center position. A first wire 39 is wrapped around and mounted on the lateral shaft 35. Each end of the first wire 39 extends downward and forms the front spring 38 and the back spring 40 (the front spring 38 is shown in FIG. 2 and the back spring 40 is directly behind the front spring 38). When the primary shaft 11 is released from its forward position, the back spring 40 provides a resilient force on the lateral shaft 35 to restore the primary shaft 11 to its initial, center position. At the same time, the front spring 38 provides no force on the lateral shaft 35 but instead applies force on a center brace 59. The back spring 40 restores the primary shaft 11 to the center position by exerting force against an extension of the lateral shaft 35 whenever the primary shaft 11 is moved forward from its initial, center position along the y-axis. When the primary shaft 11 is released from its backward position, the front spring 38 provides a resilient force on the lateral shaft 35 to restore the primary shaft 11 to its initial, center position. At the same time, the back spring 40 now provides no force on the lateral shaft 35 but instead applies a force on the center brace 59. The front spring 38 restores the primary shaft 11 to the center position by exerting force against an extension of the lateral shaft 35 whenever the primary shaft 11 is moved from its initial, center position along the y-axis. When the primary shaft 11 is in its initial, center position, the front spring 38 and the back spring 40 exert substantially equal force on both sides of the center brace 59 that extends out from the bracket 77 attached to the inside of the housing 25.

Figure 3:
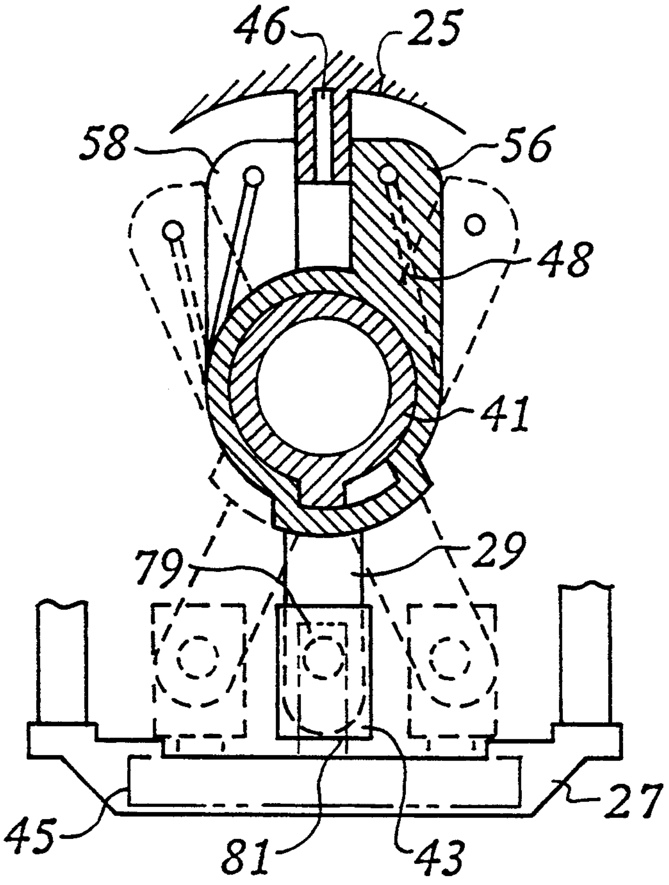
FIG. 3 is a cross-section of the front view of the shaft and potentiometer for motion in the x-axis direction.

As shown in FIGS. 1 and 4, in order to convey lateral movement in the x-axis direction, the primary shaft 11 is connected to the rotational shaft 41 which is mounted to rotate within the housing 25 as the primary shaft 11 is moved in the x-axis direction. As the rotational shaft 41 rotates within the housing 25 in response to motion of the primary shaft 11 in the x-axis direction, a lateral shaft 29 that is connected to the other end of the rotational shaft 41, rotates with the rotational shaft 41, as shown in FIGS. 1 and 3. As the lateral shaft 29 moves in response to motion of the primary shaft in the x-axis direction, an x-axis cam 43 that is connected to the other end of lateral shaft 29 is carried by a third slot 79 and moves in the x-axis direction. Movement of the x-axis cam 43 in the x-axis direction also moves the attached slide contact 81 of an x-axis potentiometer 45. As the x-axis cam 43 moves in the x-axis direction, the slide contact 81 moves in the x-axis direction along the x-axis potentiometer 45, thereby varying the resistance or the voltage division between end contacts of the x-axis potentiometer 45 to provide a representative electrical indication of the amount of x-axis movement of the primary shaft 11. The x-axis potentiometer 45 is held in place by a bracket 27.

As shown in FIGS. 1 and 3, with respect to movement of the primary shaft 11 in the x-axis direction, a left spring 46 and a right spring 48 maintain the primary shaft 11 in, and restore the primary shaft 11 to, its initial center position. A second wire 47, shown in FIG. 1, is wrapped around and fastened to the rotational shaft 41. Each end of the second wire 47, shown in FIG. 3, extends upward and forms the left spring 46 and the right spring 48. The left spring 46 is fastened to the back plate 58, and the right spring 48 is fastened to the front plate 56.

The back plate 58 and the front plate 56 are connected to the rotational shaft 41. The back plate 58 is mounted to rotate with the rotational shaft 41 when the primary shaft 11 is moved left in the x-axis direction but to maintain its initial position when the primary shaft 11 is moved right in the x-axis direction. The front plate 56 is mounted to rotate with the rotational shaft 41 when the primary shaft 11 is moved right in the x-axis direction but to maintain its initial position when the primary shaft 11 is moved left in the x-axis direction. When the primary shaft 11 is moved left in the x-axis direction, the back plate 58 also moves and the front plate 56 remains pressed against the extension from the housing 25 and limits the range of motion of the primary shaft 11. When the primary shaft 11 is released from the left position on the x-axis, the left spring 46 restores the primary shaft 11 to its initial, center position by exerting a resilient force on the back plate 58. When the primary shaft 11 is moved right in the x-axis direction, the front plate 56 moves and the back plate 58 remains pressed against the extension and limits the range of motion of the primary shaft 11. When the primary shaft 11 is released from the right position on the x-axis, the right spring 48 restores the primary shaft 11 to its initial, center position by exerting a resilient force on the front plate 56. When the primary shaft 11 is in the center position, the back plate 58 and the front plate 56 rest against an extension from the housing 25 and the left spring 46 and the right spring 48 apply a substantially equal force to both sides of the extension and no unbalanced force is exerted in either direction.

The primary shaft 11 may be moved laterally in the x-axis direction and the y-axis direction individually or simultaneously, and the motion will be independently translated simultaneously to the associated slide potentiometers in the manner previously described.

The primary shaft 11 may have one or more switches attached to it for convenient manual operation by thumb, or forefinger, or other fingers. In the present case, three button-actuated switches, not shown, are mounted on the primary shaft 11 for thumb and finger actuation, and these switches may be connected via flexible wiring through the rotational shaft 41 and the longitudinal shaft 31 to circuitry within the housing 25.

I claim:

1. An apparatus comprising:

a primary shaft including distal and proximal portions, said proximal portion mounted on a rotational shaft to translate motion of the distal portion of the primary shaft in the x-axis direction to the rotational shaft, the primary shaft being coupled to a longitudinal shaft, and the longitudinal shaft having a camming device to translate motion of the primary shaft in the y-axis direction to the longitudinal shaft;

the rotational shaft being mounted to rotate freely inside a housing and to translate motion of the primary shaft in the x-axis direction to an x-axis transducer;

pin means for mounting said primary shaft on said rotational shaft, said pin means permitting said primary shaft to be rotated about an axis perpendicular to both said primary and rotational shafts;

the longitudinal shaft being positioned inside of and coextensive with the rotational shaft to rotate with the rotational shaft and to move longitudinally within the rotational shaft to translate motion of the primary shaft in the y-axis direction to a y-axis transducer; and a peg attached to the longitudinal shaft that moves within a first slot of the primary shaft to translate motion of the primary shaft in the y-axis direction to the longitudinal shaft.

2. The apparatus of claim 1 wherein a lateral shaft coupled to the longitudinal shaft on one end of said lateral shaft and to a y-axis cam on the other end of said lateral shaft is positioned between two springs, to bias the primary shaft toward its initial, center position in the y-axis direction.

3. The apparatus of claim 1 wherein at least one of said transducers is a potentiometer including a slide contact, the slide contact being mounted to generate an electrical signal representative of the motion of the primary shaft in the y-axis direction.

4. The apparatus of claim 1 wherein a lateral shaft is coupled to the rotational shaft on one end and an x-axis cam on the other end to translate motion of the primary shaft in the x-axis direction.

5. The apparatus of claim 1 wherein the x-axis transducer is a potentiometer including a slide contact for providing an electrical signal representative of the motion of the primary shaft in the x-axis direction.

6. The apparatus of claim 1 wherein two plates are mounted on the rotational shaft and are connected to two springs to bias the primary shaft toward its initial, center position in the x-axis direction and to limit the range of motion of the primary shaft in the x-axis direction.

* * * * *